United States Patent
Uragami et al.

(10) Patent No.: US 7,056,770 B2
(45) Date of Patent: Jun. 6, 2006

(54) METHOD OF RESIN ENCAPSULATION, APPARATUS FOR RESIN ENCAPSULATION, METHOD OF MANUFACTURING SEMICONDUCTOR DEVICE, SEMICONDUCTOR DEVICE AND RESIN MATERIAL

(75) Inventors: Hiroshi Uragami, Kyoto (JP); Osamu Nakagawa, Kyoto (JP); Kinya Fujino, Kyoto (JP); Shinji Takase, Kyoto (JP); Hideki Tokuyama, Kyoto (JP); Koichi Meguro, Kawasaki (JP); Toru Nishino, Kawasaki (JP); Noboru Hayasaka, Kawasaki (JP)

(73) Assignees: Towa Corporation, Kyoto (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 10/719,379

(22) Filed: Nov. 20, 2003

(65) Prior Publication Data

US 2004/0101631 A1    May 27, 2004

(30) Foreign Application Priority Data

Nov. 26, 2002   (JP) .............................. 2002-341965

(51) Int. Cl.
*H01L 21/44*   (2006.01)
(52) U.S. Cl. ...................................... 438/126; 438/127
(58) Field of Classification Search ........ 438/106–127, 438/612–617, FOR. 371, FOR. 374, FOR. 384; 29/25.01, 25.02; 264/272.11, 272.14, 272.17
See application file for complete search history.

(56) References Cited

U.S. PATENT DOCUMENTS

| | | | |
|---|---|---|---|
| 5,123,823 A | | 6/1992 | Banjo et al. |
| 5,435,953 A | | 7/1995 | Osada et al. |
| 5,733,802 A | * | 3/1998 | Inoue et al. ................. 438/127 |
| 6,081,978 A | * | 7/2000 | Utsumi et al. ............. 29/25.01 |
| 6,187,243 B1 | | 2/2001 | Miyajima |
| 6,287,503 B1 | * | 9/2001 | Thummel ............... 264/272.13 |
| 6,335,221 B1 | * | 1/2002 | Mess .......................... 438/106 |
| 6,596,561 B1 | * | 7/2003 | Takahashi et al. .......... 438/113 |
| 2001/0008775 A1 | | 7/2001 | Yamamoto |
| 2003/0235636 A1 | * | 12/2003 | Tsai et al. ................... 425/116 |

FOREIGN PATENT DOCUMENTS

| | | |
|---|---|---|
| DE | 41 02 934 | 8/1991 |
| EP | 1 035 572 | 9/2000 |
| JP | 01097622 A * | 4/1989 |
| JP | 05198707 A * | 8/1993 |

* cited by examiner

*Primary Examiner*—Brook Kebede
(74) *Attorney, Agent, or Firm*—W. F. Fasse; W. G. Fasse

(57) ABSTRACT

First, a board is placed on a board mounting portion with a lower mold and an upper mold being opened. Then, a resin material having such size and shape that correspond to the size and shape of a cavity formed in the lower mold is fitted in the cavity. Thereafter, the resin material is heated resulting in melted resin. Thereafter, the lower mold and the upper mold are closed, with a space formed by the upper mold and the lower mold being reduced in pressure. As a result, chips and wires are immersed in the melted resin. Thereafter, the melted resin is set, so that a resin mold product including the board and the set resin is formed.

9 Claims, 5 Drawing Sheets

METHOD OF RESIN ENCAPSULATION, APPARATUS FOR RESIN ENCAPSULATION, METHOD OF MANUFACTURING SEMICONDUCTOR DEVICE, SEMICONDUCTOR DEVICE AND RESIN MATERIAL

BACKGROUND OF THE INVENTION

Field of the Invention

The present invention relates to a method and the like for resin-encapsulation of electronic components on a board.

Description of the Background Art

A conventional method of resin encapsulation, used in manufacturing a semiconductor package as an example of a resin mold product having electronic components mounted on a board will be outlined in the following.

In the conventional method of resin encapsulation, first, a printed circuit (wiring) board (hereinafter simply referred to as a board) having semiconductor chips (hereinafter simply referred to as chips) as exemplary electronic components mounted thereon is prepared. Thereafter, on one of a pair of molds having one mold and the other mold positioned opposed to each other, the board is placed. Then, the mold pair is closed. Thereafter, through a resin flow path, melted resin is introduced into a cavity provided in the other mold of the mold pair. At this time the melted resin is pressurized.

Thereafter, the introduced resin sets. Thus, a resin molded product is formed. Then, the mold pair is opened. The resin molded product is taken out from the one mold. Then, the resin molded product is diced and divided into a plurality of semiconductor packages. Thus, a semiconductor package as a final product is complete.

Recently, the number of terminals of the semiconductor chip has been increased as compared with conventional chips. Further, a structure has been used in which semiconductor chips are stacked on a board. Further, the semiconductor package has been made thinner.

In addition, wires electrically connecting the semiconductor chip to the board have been made longer, and the space between adjacent wires becomes narrower. As a result, the conventional method of resin molding described above tends to cause the following problems.

First, it has become more likely that the wire is deformed or disconnected because of the flow of the melted resin introduced into the cavity. Further, it has become more likely that adjacent wires are undesirably brought into contact with each other. In order to solve such problems, it may be helpful to decrease the speed of introduction of the melted resin into the cavity. When the speed of introduction of the melted resin is decreased, however, the melted resin that is being introduced comes to have higher viscosity. This makes it difficult for the gas in the melted resin to escape to the outside. Accordingly, voids or unfilled portions tend to result in the set resin mold.

Further, recently, there is a demand for the boards of larger size, in order to reduce cost for semiconductor products. When electronic components are to be resin-encapsulated on a large board, flow distance of the melted resin becomes longer than when the electronic components are resin-encapsulated on a small board. This increases the possibility of voids or unfilled portions mentioned above.

It is also noted that the resin may undesirably set on the resin flow path. The resin set on the resin flow path is discarded, and therefore, the conventional method of resin encapsulation involves the problem of waste of resin material.

SUMMARY OF THE INVENTION

The present invention was made to solve the above described problems and its object is to reduce possibility of generating defective resin mold products and to efficiently use resin material, when electronic components mounted on a board is resin-encapsulated.

In order to attain the above described object, the present invention provides methods of resin encapsulation in accordance with one and another aspects. The methods of both aspects attain resin encapsulation of electronic components mounted on a main surface of the board, using a pair of molds having an upper mold and a lower mold. The methods in accordance with the one and another aspects will be described in the following.

In the method of resin encapsulation in accordance with one aspect of the present invention, the following steps are executed. First, a board is attached to the upper mold. Then, melted resin is generated in a cavity provided in the lower mold. Thereafter, the mold pair is closed. Thus, the electronic components are immersed in the melted resin. Then, the resin sets in the cavity. In this manner, a resin mold product is formed.

According to this method, the melted resin flows almost uniformly over the entire region of a plane parallel to the board, and flows in the depth direction of the cavity in a very short time period. Thus, voids left in the set resin and portions not filled with the set resin in the resin mold product can be prevented.

In the step of generating the melted resin, the melted resin may be formed by heating a solid resin material placed in the cavity. By this method, the resin flow path becomes unnecessary. Accordingly, resin set in the resin flow path can be avoided and, as a result, the resin material can be used efficiently.

The above described method is applicable where electrodes of the board are connected to electrodes of the electronic components by means of a conductive material in the form of loops in a prescribed plane. In this case, in the step of immersing the electronic components in the melted resin, the prescribed plane should preferably move substantially vertically to the main surface of the melted resin.

According to the method above, a force applied from the melted resin to the conductive material is not in a direction that the conductive material easily deforms. Therefore, possible damage to the conductive material can be suppressed.

In the method of resin encapsulation in accordance with another aspect of the present invention, a solid resin material is used, and the following steps are executed.

First, the board is placed on the lower mold. Then, the resin material is mounted on a main surface of the board such that the resin material is not in contact with the conductive material connecting the electrodes of the board to the electrodes of the electronic components. Thereafter, the mold pair is closed. The resin material is then heated. Thus, melted resin is generated on the main surface of the board. Further, the electronic components are enveloped within the melted resin. Thereafter, the melted resin sets, and the resin mold product is formed.

By this method also, similar effects as attained by the method of resin encapsulation in accordance with the one aspect above can be attained.

The resin encapsulating apparatus of the present invention includes means for executing the method of resin encapsulation in accordance with the one and the other aspects described above. The method of manufacturing a semiconductor device of the present invention utilizes the method of resin encapsulation in accordance with the one and the other aspects described above. Further, the semiconductor device of the present invention is manufactured by the method above.

Next, the resin material in accordance with the present invention will be described.

The resin material of the present invention is used when electronic components mounted on a main surface of a board are resin-encapsulated by setting melted resin generated in a cavity formed in a mold pair. Further, the resin material is a solid, raw material for the melted resin. Further, the resin material has such size and shape that correspond to the size and shape of the cavity.

To the resin material, heat is transmitted from the surfaces of the mold that form the cavity. Therefore, when this material is used in the method of resin encapsulation in accordance with the other aspect of the invention described above, the heat transmitted from the surfaces of the mold can be effectively used and the melted resin can be obtained in a very short time period.

Alternatively, the resin material mentioned above may be prepared such that when the resin material is placed on the main surface of the board, a space formed between the board and the resin material encloses the electronic components. In this case, the size of the space is preferably set such that the resin material is not in contact with the conductive material connecting the electrodes of the board to the electrodes of the electronic components.

By such setting, generation of stress in the conductive material caused by the contact of the resin member and the conductive material can be prevented in the method of resin encapsulation in accordance with the other aspect described above. As a result, damage to the conductive material caused by the generation of internal stress at the time of resin encapsulation can be prevented.

Further, desirably, a notch is provided in the resin material in order to let the gas in the space go out from the resin material, when the resin material is melted by heat.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, the method of resin encapsulation in accordance with an embodiment of the present invention, the resin encapsulating apparatus used therefor, the method of manufacturing a semiconductor device utilizing the same, the semiconductor device manufactured thereby, and the resin material used therefor will be described with reference to the figures.

First Embodiment

Referring to FIGS. 1A to 3B, the method of resin encapsulation in accordance with the first embodiment will be described.

Figure 1A:
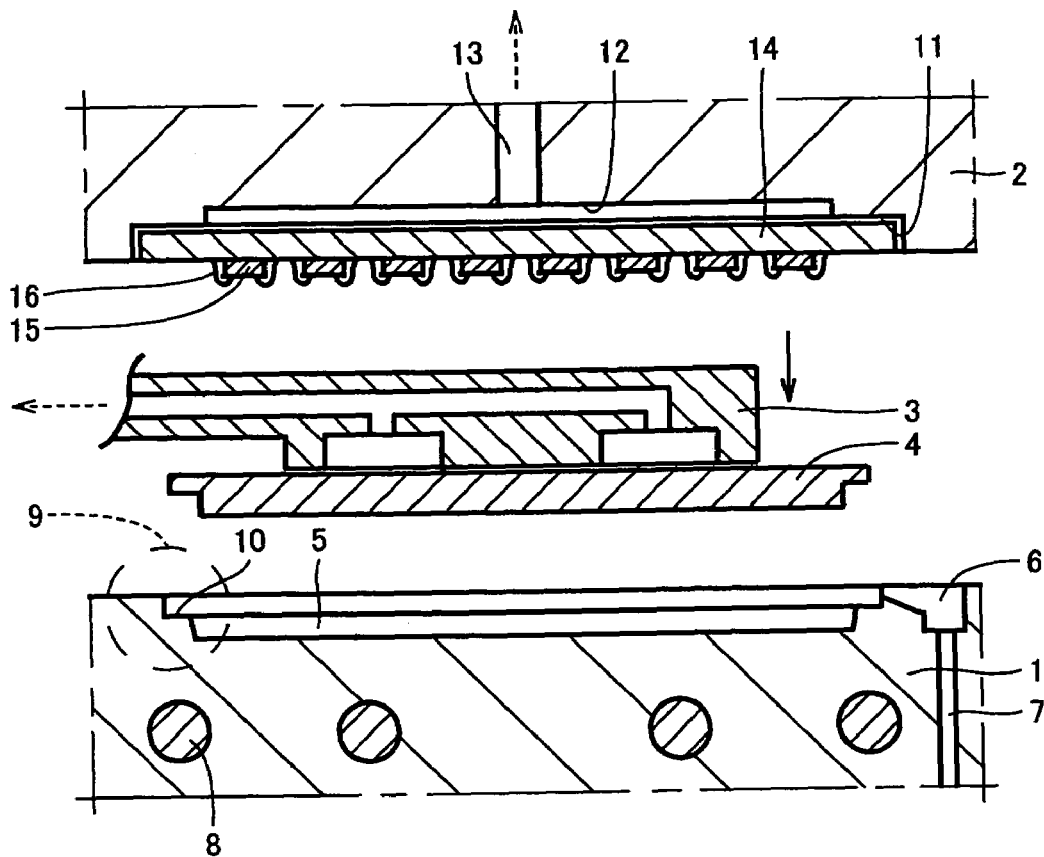
FIG. 1A is a partial cross sectional view of a resin encapsulating apparatus in accordance with a first embodiment of the present invention, before the resin material is placed in the cavity.
Figure 1B:
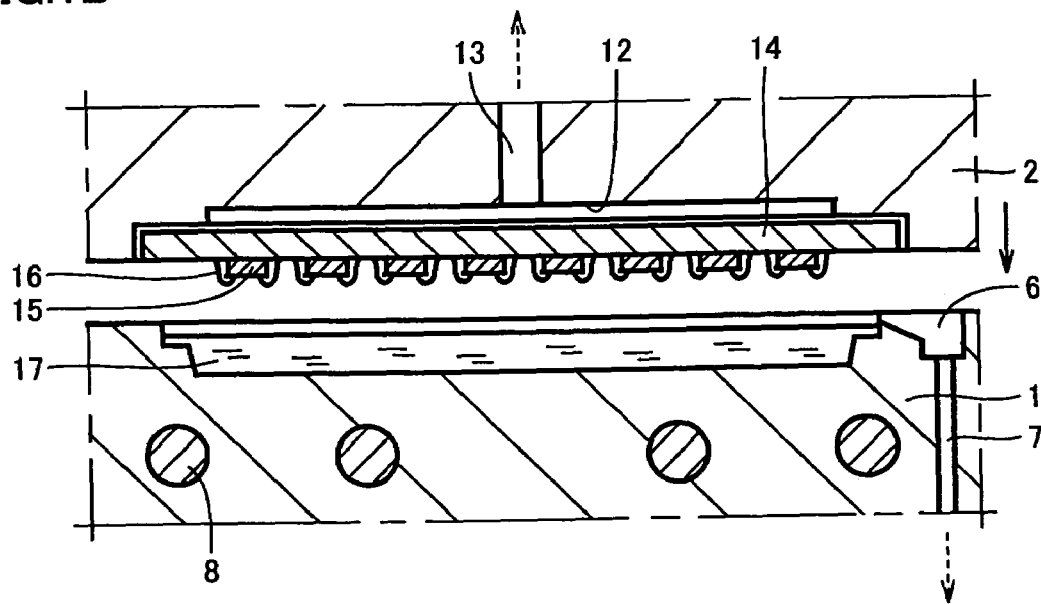
FIG. 1B is a partial cross sectional view of the resin encapsulating apparatus in accordance with the first embodiment of the present invention, after the melted resin is generated in the cavity and before the mold pair is closed.

As can be seen from FIGS. 1A and 1B, in the resin encapsulating apparatus used for the method of resin encapsulation of the present embodiment, a mold pair is provided that has a lower mold 1 and an upper mold 2 opposing to each other. Further, the resin encapsulating apparatus is further provided with press means (not shown) for opening and closing lower mold 1 and upper mold 2.

Further, FIG. 1A shows a conveyer unit 3 positioned in a space between lower mold 1 and upper mold 2. By the function of a driving mechanism, not shown, conveyer unit 3 can be inserted to the space between lower mold 1 and upper mold 2, and also by the function of the driving mechanism, conveyer unit 3 can be moved from the space between lower mold 1 and upper mold 2 to the outside of the space. A resin material in the form of a plate is fixed to conveyer unit 3 by adsorption based on vacuum action. Further, conveyer unit 3 can be moved downward while holding resin material 4 thereon, by the function of the driving mechanism. Therefore, the resin encapsulating apparatus in accordance with the present embodiment is capable of supplying resin material 4 into a cavity 5 of lower mold 1.

Lower mold 1 is provided with the cavity 5, and resin material 4 is fit therein. Melted resin is filled in cavity 5, as will be described later. Lower mold 1 is further provided with a resin pool 6. Resin pool 6 is communicated with cavity 5. Resin pool 6 is also communicated with a gas flow path 7. Gas flow path 7 is connected to a decompression pump through a duct and a valve (all not shown). Gas flow path 7 may be connected to a pressure source (not shown) such as a compressed air tank, as needed. Further, a heater for heating peripheral portions of cavity 5 is provided near the cavity 5 inside lower mold 1.

Resin material 4 is a thermosetting resin that sets when heated. The shape and size of resin material 4 correspond to the shape and size of cavity 5. In other words, the shape of mold surfaces of cavity 5 substantially matches the outer shape of resin material 4. Namely, all the mold surfaces of cavity 5 are in contact with or very close to the surfaces of resin material 4. Further, as can be seen from FIG. 1A, a stepped portion 10 is provided at a closing portion 9 at an upper part of cavity 5. Resin material 4 is formed to have a shape corresponding to the stepped portion 10. Therefore, resin material 4 is fit in cavity 5 such that there is no space formed between resin material 4 and cavity 5. Specifically, the entire side surfaces and lower surface of resin material 4 shown in FIG. 1A are substantially in contact with the entire mold surfaces of cavity 5.

Upper mold 2 is provided with a recessed, board holding portion 11. At the bottom surface (upper surface in FIG. 1A) of board holding portion 11, a recessed suction portion 12 is formed. A gas flow path 13 is communicated with recessed suction portion 12. Gas flow path 13 is connected to a decompression pump through a duct and a valve (all not shown). By the function of the decompression pump, the air in the recessed suction portion 12 is absorbed through gas flow path into decompression pump. Accordingly, recessed suction portion 12 comes to have negative pressure. As a result, board 14 is attracted by suction and held on board suction holding portion 11.

Assume that the main surface of substrate 14 is divided into a plurality of virtual areas by lattice-like phantom lines. On the board 14 in each of the plurality of virtual areas, one chip 15 is mounted. Further, board 14 is electrically connected to respective electrodes of the plurality of chips 15 (not shown) by means of wires 16. Therefore, when diced along the phantom lines, semiconductor packages are formed, in each of which one chip 15 is mounted on one piece of the divided board 14.

The method of resin encapsulation in accordance with the present embodiment will be described in the following. First, as shown in FIG. 1A, lower mold 1 and upper mold 2 are opened. Next, using board conveying means (not shown), a board 14 is placed on board holding portion 11. Thereafter, using the decompression pump, the air in recessed suction portion 12 is absorbed, through gas flow path 13. Thus, board 14 is attracted by suction and held on board holding portion 11.

Further, conveyer unit 3 moves to immediately above cavity 5 while resin material 4 is held by suction on conveyer unit 3. Thereafter, resin material 4 is taken out from conveyer unit 3. Thus, resin material 4 falls into cavity 5. As a result, resin material 4 is fit in cavity 5. Alternatively, conveyer unit 3 may move downward from above cavity 5 to the vicinity of cavity 5, and thereafter, conveyer unit 3 may release resin material 4 so that resin material 4 is fitted in cavity 5.

Thereafter, lower mold 1 is heated by heater 8. Consequently, heat that has been transmitted through lower mold 1 is transmitted from lower mold 1 to resin material 4. Thus, resin material 4 is heated and melted. In this manner, melted resin 17 results as shown in FIG. 1B. Thereafter, upper mold 2 is moved downward until wires 16 are positioned close to the surface of melted resin 17. The above described series of process steps for resin molding is executed while the air in the space between lower mold 1 and upper mold 2 is fed into decompression pump 7 through gas flow path 7, that is, while the pressure in the space between lower mold 1 and upper mold 2 is reduced.

Figure 2A:
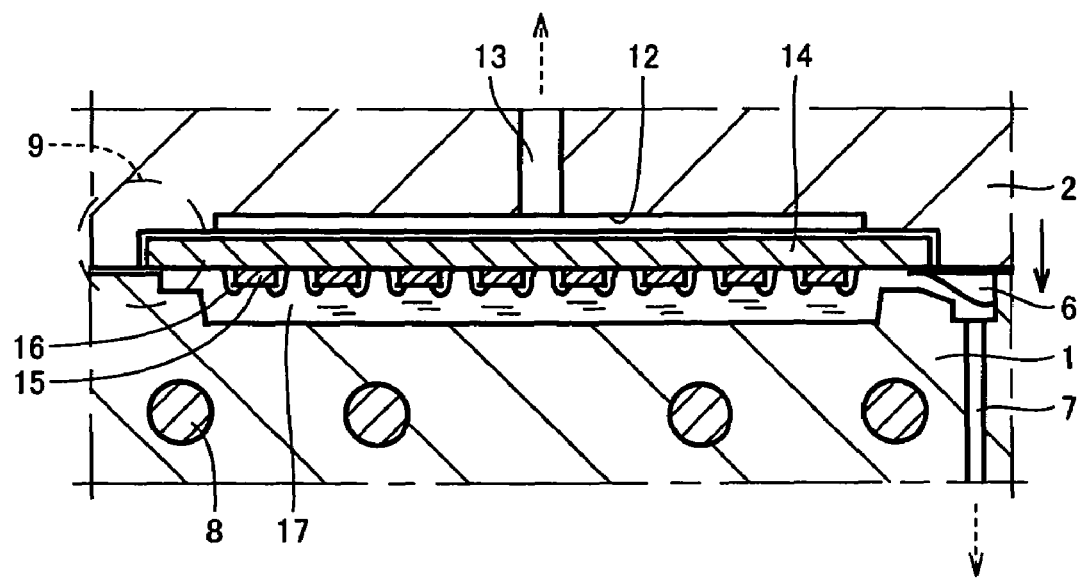
FIG. 2A is a partial cross sectional view of the resin encapsulating apparatus in accordance with the first embodiment of the present invention, showing chips mounted on the board immersed in the melted resin, as the mold pair is closed.

Then, upper mold 2 is further lowered as shown in FIG. 2A. Thus, closing of lower mold 1 and upper mold 2 is complete. Consequently, chips 15 and wires 16 are immersed in melted resin 17. At this time, portions of board 14 around portions having chips 15 mounted thereon are also immersed in melted resin 17. Further, the space including cavity 5 is reduced in pressure. Therefore, gas existing in cavity 5 is prevented from entering melted resin 17. Hence, generation of any void in melted resin 17 is suppressed. Melted resin 17 that spills over cavity 5 flows into resin pool 6.

Figure 2B:
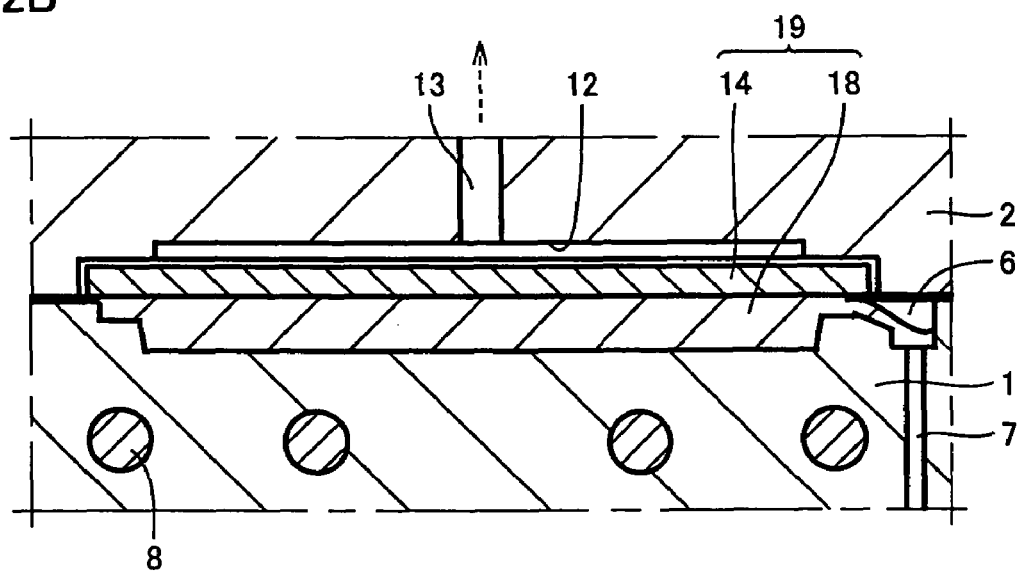
FIG. 2B is a partial cross sectional view of a resin encapsulating apparatus in accordance with the first embodiment of the present invention, showing the resin set in the cavity.

Thereafter, melted resin 17 sets as shown in FIG. 2B, and set resin 18 results in cavity 5. Set resin 18 and board 14 enclose chips 15 and wires 16 shown in FIG. 2A. A resin mold product 19 is thus complete.

Figure 3A:
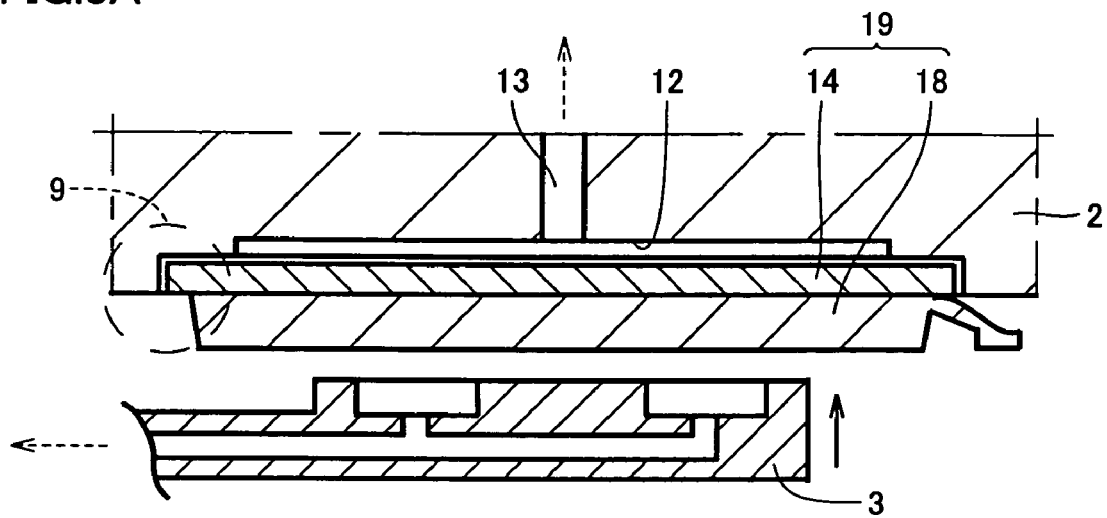
FIG. 3A is a partial cross sectional view of the resin encapsulating apparatus in accordance with the first embodiment of the present invention, after the mold pair is opened and before the resin mold product is taken out from the upper mold.
Figure 3A:
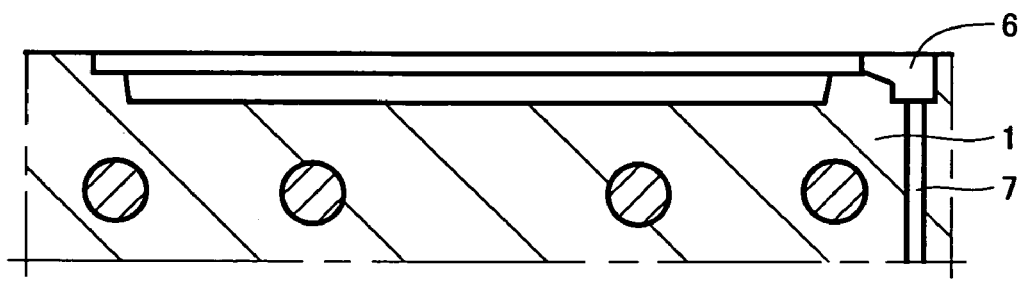
Figure 3B:
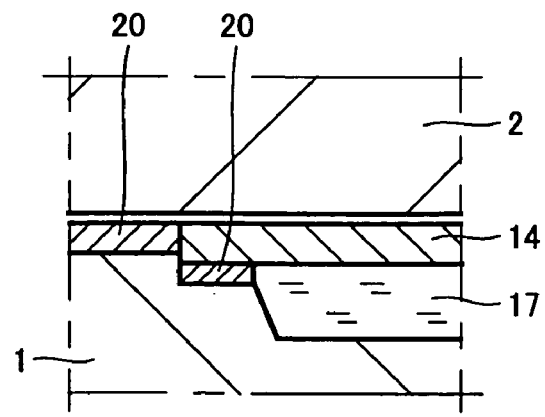
FIG. 3B is a partial cross sectional view of the resin encapsulating apparatus in accordance with the first embodiment of the present invention, showing the closing portion when the mold pair is closed.

Next, as shown in FIG. 3A, upper mold 2A is moved upward, and lower mold 1 and upper mold 2 are opened. Thereafter, resin mold product 19 is taken out from upper mold 2. By feeding compressed air from a pressure pump through gas flow path 7 to resin pool 6, set resin formed in resin pool 6 may be released from lower mold 1, as needed.

When resin mold product 19 is taken out from upper mold 2, suction of air in recessed suction portion 12 by the decompression pump is stopped. Thus, resin mold product 19 held by suction on board holding portion 11 falls onto conveyer unit 3 inserted to the space therebelow. Thereafter, conveyer unit 3 conveys resin mold product 19 to a position where storage means such as a tray is provided or to a position for the next process step. Then, resin mold product 19 is cut by a dicer, and semiconductor packages as final products are complete.

One characteristic of the method of resin encapsulation in accordance with the present embodiment is that resin material having such shape and size that correspond to the size and shape of cavity 5 is used. Because of this characteristic, it becomes possible to obtain melted resin 17 in a very short time period, by heating resin material 4 in cavity 5.

Another characteristic of the method of resin encapsulation in accordance with the present embodiment is that chips 15 and wires 16 mounted on board 14 are gradually immersed in melted resin 17 when lower mold 1 and upper mold 2 are closed.

Accordingly, melted resin 17 moves for a very short period of time in a direction vertical to the main surface of board 14, that is, the depth direction of cavity 5. Further, melted resin 17 as a whole moves almost uniformly. It is noted that melted resin 17 hardly moves in a direction orthogonal to the plane including the loop wires 16. Specifically, melted resin 17 hardly moves in a direction along which the loop wires tend to go down or deform. In other words, melted resin 17 moves in a direction parallel to the plane including loop wires 16. In summary, melted resin 17 moves in a direction along which the loop wires 16 are least susceptible to deformation, that is, the direction from the top to the bottom of loop wires.

According to the method of resin encapsulation described above, chips 15 and wires 16 are immersed in melted resin 17 while the space including cavity 5 is reduced in pressure. Therefore, bubbles hardly enter melted resin 17. As a result, generation of any void in melted resin 17 can be suppressed.

In summary, according to the method of resin encapsulation of the present embodiment, viscosity of melted resin 17 is low, that is, the melted resin maintains high fluidity, and excessive external force is not applied to wires 16 during resin molding. As a result, even when electronic components are to be resin-encapsulated on a large board, defects such as formation of voids in the resin, formation of portions not filled with the resin and deformation of wires can be prevented.

Further, according to the method of resin encapsulation of the present embodiment, the resin flow path becomes unnecessary, and therefore, wasteful resin set in the resin flow path can be eliminated, enabling efficient use of the resin material.

In the method of resin encapsulation in accordance with the present embodiment, resin material 4 having such size and shape that correspond to the size and shape of cavity 5 is used. It is noted, however, that a method of resin encapsulation in which a prescribed amount of granular resin or liquid resin is fed to cavity 5 in place of resin material 4 can also attain the same effect as attained by the method of resin encapsulation of the present embodiment described above.

Further, in order to maintain air-tightness of the space between upper mold 2 and lower mold 1, a sealing member 20 formed of a deformable plastic sheet may desirably be provided at closing portion 9. A frame-like member having a circular cross section (O-ring) may be used as the sealing member.

Second Embodiment

Next, the method of resin encapsulation in accordance with the second embodiment will be described with reference to FIGS. 4A to 5B. FIGS. 4A to 5B show the structure of the resin encapsulating apparatus in accordance with the present embodiment. In each of FIGS. 4A to 5B, portions denoted by the same names as the components of the resin encapsulating apparatus in accordance with the first embodiment described with reference to FIGS. 1A to 3B have the same functions as in the first embodiment, and therefore, description thereof will not be repeated.

Referring to FIGS. 4A to 5B, in the resin encapsulating apparatus in accordance with the present embodiment, board 14 is placed on lower mold 21. On board 14, resin material 22 is placed. Resin material 22 has such size and shape that correspond to the size and shape of a cavity (which will be described later) formed in upper mold 25. Resin material 22 has a flat portion 23 and edge portions 24. As can be seen from FIGS. 4A and 4B, resin material 22 is placed on board 14 such that flat portion 23 extends in a direction parallel to board 14 and edge portions 24 extend in a direction vertical to board 14 and flat portion 23, respectively.

Figure 4A:
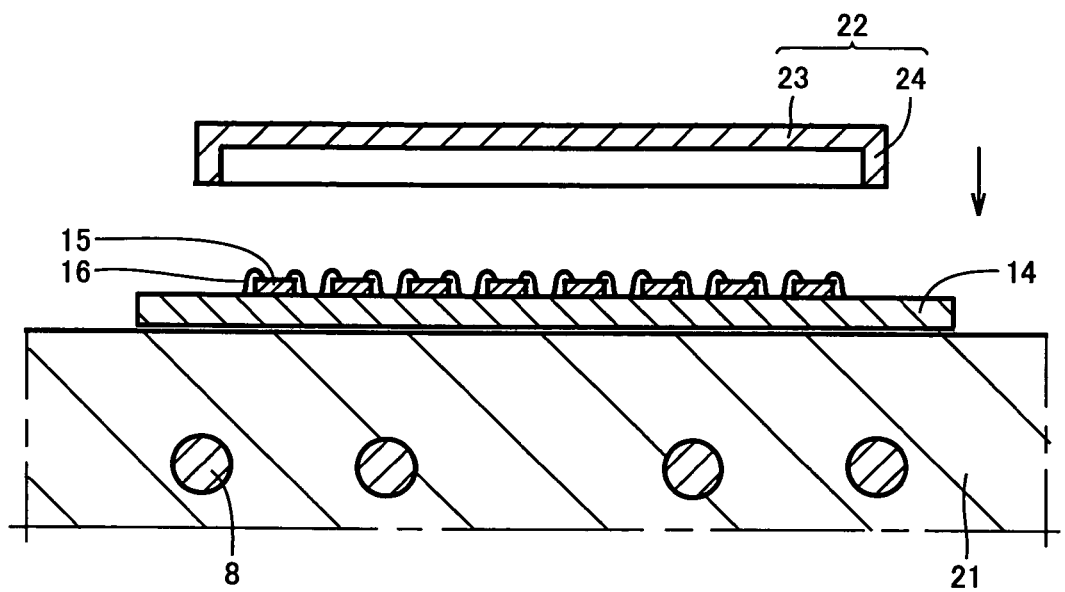
FIG. 4A is a partial cross sectional view of a resin encapsulating apparatus in accordance with a second embodiment of the present invention, before the resin material is placed on the board.
Figure 4B:
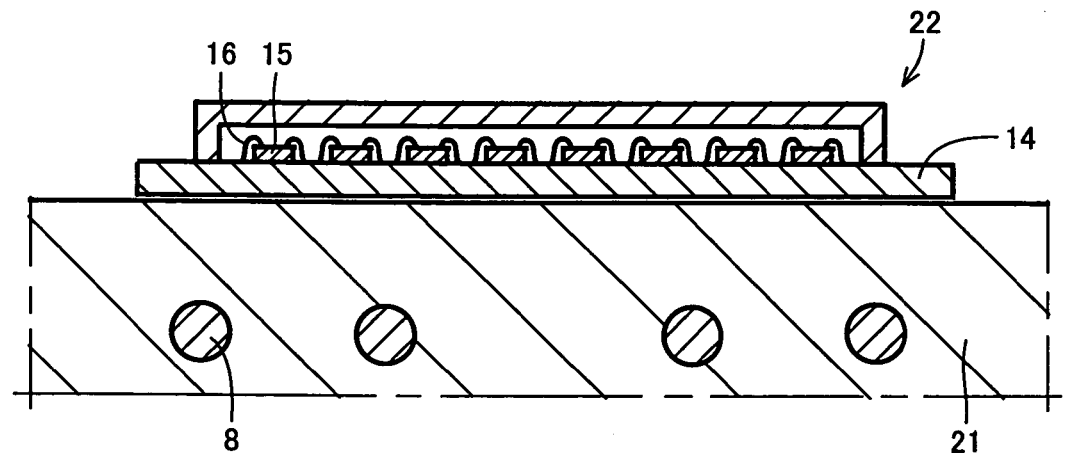
FIG. 4B is a partial cross sectional view of the resin encapsulating apparatus in accordance with the second embodiment of the present invention, when the resin material is placed on the board.

Here, referring to FIG. 4B, when the height of a space formed by the inner side surfaces of flat portion 23 and edge portions 24 and the main surface of board 14 in a direction vertical to the main surface of board 14 is higher than wires 16, contact between flat portion 23 and wires 16 can be avoided. It is desirable to form a notch at the edge portion 24 in order to let go the gas in the above described space, when resin material 22 is melted by heating.

Figure 5A:
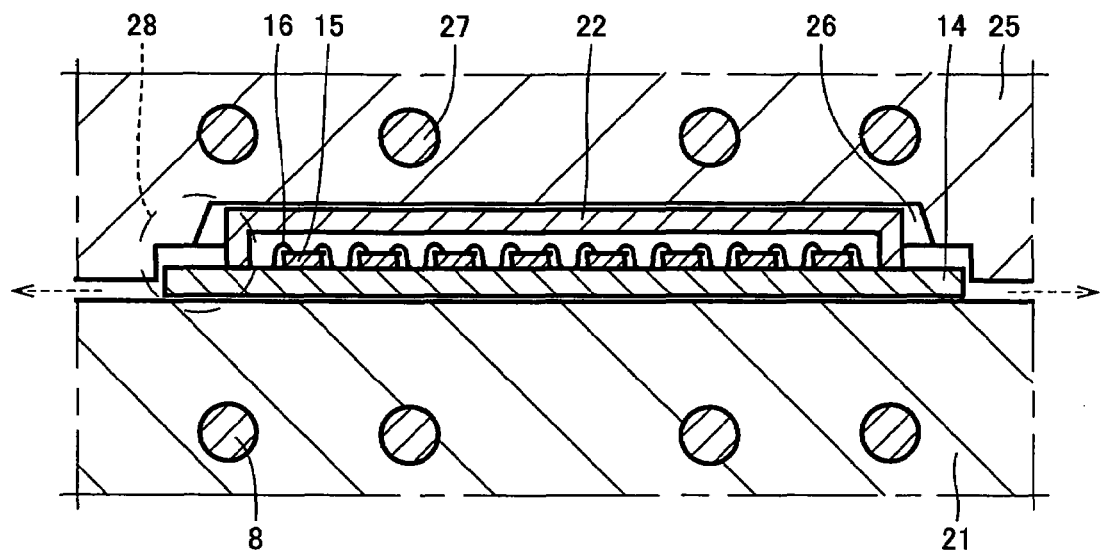
FIG. 5A is a partial cross sectional view of the resin encapsulating apparatus in accordance with the second embodiment of the present invention, showing the resin material being heated as the upper mold is brought into contact with the resin material.

In the resin encapsulating apparatus of the present embodiment, a heater 27 is provided inside upper mold 25, as shown in FIG. 5A. Further, there is a cavity 26 in upper mold 25. On a portion of closing portion 28 on the side of upper mold 25, a sealing member similar to sealing member 20 (see FIG. 3B) in accordance with the first embodiment may be provided. On either one of upper mold 25 and lower mold 21, a resin pool and a gas flow path similar to resin pool 6 and gas flow path 7 (see FIGS. 1A and 1B) in accordance with the first embodiment may be provided.

The method of resin encapsulation in accordance with the present embodiment will be described in the following. First, as shown in FIG. 4A, board 14 is placed on a prescribed position of lower mold 21, with the metal mold opened. In this state, lower mold 21 heated by heater 8 heats board 14.

Next, referring to FIG. 4B, resin material 22 is placed on a prescribed position on board 14. In this state, the heat radiated from board 14 is transmitted to resin material 22. Thus, resin material 22 is heated. Before the start of the heat treatment step, the height of the space formed between resin material 22 and board 14 is sufficiently higher than the height of wires 16 as described above, and therefore, resin material 22 is not in contact with wires 16.

Next, as shown in FIG. 5A, upper mold 25 heated by heater 27 is moved closer to flat portion 23 of resin material 22, so as to further heat resin material 22. As a result, resin material that is heated both by upper mold 25 and lower mold 21 gradually melts. In this state, lower mold 21 and upper mold 25 are not fully closed yet. Thereafter, as the resin material 22 melts resulting in melted resin 17, upper mold 25 is moved gradually downward to lower mold 21. Mold closing is complete when upper mold 25 comes into contact with lower mold 21.

Figure 5B:
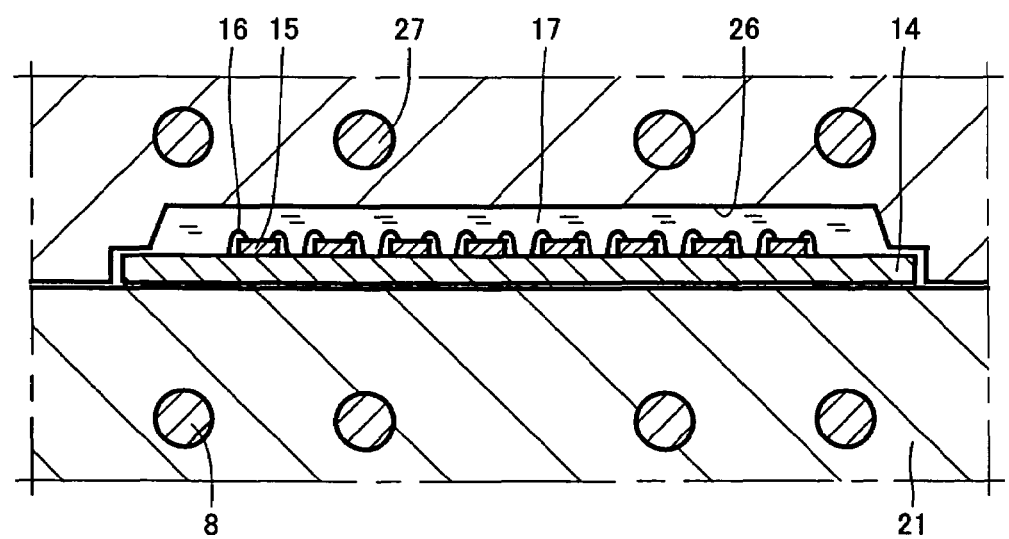
FIG. 5B is a partial cross sectional view of the resin encapsulating apparatus in accordance with the second embodiment of the present invention, showing the melted resin filled in the cavity as the resin material is melted, with the mold pair closed.

The above described series of operations is performed while reducing the pressure in the space formed between upper mold 21 and lower mold 25. Thereafter, as shown in FIG. 5B, melted resin is continuously heated, with the cavity 26 filled with melted resin 17.

Thereafter, similar to the process step described with reference to FIG. 2B of the first embodiment, melted resin is set. Thus, resin mold product 19 is formed. Thereafter, similar to the process step described with reference to FIG. 3A of the first embodiment, resin mold product 19 is taken out, and the resin mold product is conveyed to the position where the storage means such as a tray is provided or to a position for the next process step.

One characteristic of the method of resin encapsulation in accordance with the present embodiment is that resin material 22 has such size and shape that correspond to the size and shape of cavity 26. Another characteristic of the method of resin encapsulation in accordance with the present embodiment is that chips 15 and wires 16 are enclosed in a space formed by board 14 and resin material 22 such that wires 16 are not in contact with resin material 22. A further characteristic of the method of resin encapsulation in accordance with the present embodiment is that resin material 22 placed on board 14 is heated and melted as it is brought closer to or brought into contact with upper mold 25.

According to the method of resin encapsulation in accordance with the present embodiment having the above described characteristics, resin material 22 is not in contact with wires 16 in a solid state before it is melted.

Further, melted resin 17 resulting from resin material 22 moves in a very short period, in a direction vertical to the main surface of board 14, that is, in the depth direction of cavity 5. Accordingly, chips 15 and wires 16 mounted on board 14 are buried in melted resin 17. Therefore, according to the method of resin encapsulation of the present embodiment, similar to the method of resin encapsulation of the first embodiment, defects such as formation of voids in the set resin of the resin mold product, formation of portions not filled with resin in the resin mold product or deformation of wires 16 can be prevented. Further, according to the method of resin encapsulation of the present embodiment, resin encapsulation is completed in a very short period of time.

Further, as the resin flow path becomes unnecessary and the resin set in the resin flow path is eliminated, the resin material can be used efficiently. Further, as the board 14 is positioned not on upper mold 25 but on lower mold 21, the mechanism for suction-attracting the board 14 becomes unnecessary. As a result, the mechanism of the resin encapsulating apparatus can be simplified.

In the method of resin encapsulation in accordance with the first and second embodiments, resin materials 4 and 22 have been described as thermosetting resin. Resin materials 4 and 22 may be thermoplastic resin. In that case, resin material 4, 22 is heated and melted, and after upper mold 2, 25 and lower mold 1, 21 are closed, temperature of upper mold 2,25 and lower mold 1,21 is decreased to set melted resin 17.

Further, in the method of resin encapsulation in accordance with the first and second embodiments described above, a decompression pump (not shown) is provided in the resin encapsulating apparatus, and the pressure in the space formed between upper mold 2, 25 and lower mold 1, 21 is reduced by the decompression pump. A method may be employed, however, in which the decompression pump is not used, in order to suppress undesirable influence on amount of gas included in resin material 4, 22 and to prevent undesirable influence on the quality required of the resin mold product 19.

According to the first and second embodiments, in the object of resin encapsulation, wires 16 are used as the conductive material for electrically conducting electrodes of board 14 and electrodes of chips 15. It is noted, however, that a flip-chip, having the electrodes of board 14 directly connected to electrodes of chips 15, may be the object of resin encapsulation.

Further, the material of board 14 may be metal as in the case of a lead frame, or it may be a resin-based material such as a common printed board. Alternatively, board 14 may be a metal-based substrate or a ceramic substrate. Board 14 may be a substrate for a so called wafer level package, that is, a semiconductor substrate such as a silicon substrate, a compound semiconductor substrate or an SOI (Silicon On Insulator) substrate, having interconnections of Cu or the like printed on a main surface thereof. In that case, desirably, resin material 4 of the first embodiment is a flat plate having such size and shape that correspond to the size and shape of cavity 5, with the thickness of the plate being deeper than the depth of cavity 5.

Preferably, resin material 22 shown in FIG. 5A placed above the main surface of board 14 has such size and shape that correspond to the size and shape of cavity 26. In that case, desirably, thickness of resin material 22 is larger than the depth of cavity 26. Resin material 22 having such thickness is directly in contact with both board 14 and upper mold 25, and hence, resin material 22 is heated both from above and from below. Therefore, resin material 22 can be melted in a very short time period as compared with the conventional method.

Further, board 14 may be a board used for manufacturing a chip capacitor, for example, other than the semiconductor substrates.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of resin-encapsulating an electronic component mounted on a main surface of a board, using a mold pair having an upper mold and a lower mold, comprising the steps of:
    attaching said board on said upper mold;
    generating melted resin in a cavity provided in said lower mold solely by melting a solid resin material in said lower mold cavity;
    immersing said electronic component in said melted resin in said lower mold cavity by closing said mold pair; and
    forming a resin molded product including said electronic component encapsulated in a set resin by setting said melted resin in said lower mold cavity to produce said set resin only from said melted resin that was generated from said solid resin material in said lower mold cavity.

2. The method of resin encapsulation according to claim 1, further comprising, before said step of generating melted resin, another step of placing said solid resin material in said lower mold cavity.

3. The method of resin encapsulation according to claim 1, wherein
    an electrode of said board and an electrode of said electronic component are connected by a conductive material forming a loop in a prescribed plane; and
    in said step of immersing said electronic component in said melted resin, said prescribed plane moves substantially vertically to a main surface of said melted resin.

4. A method of manufacturing a semiconductor device, using the method of resin encapsulation according to claim 1.

5. A method of resin-encapsulating an electronic component mounted on a main surface of a board, using a mold pair having an upper mold and a lower mold and a solid resin material for resin encapsulation, comprising the steps of:
    placing said board on said lower mold;
    placing said solid resin material on a main surface of said board such that said solid resin material is not in contact with a conductive material connecting an electrode of said board with an electrode of said electronic component;
    closing said mold pair to form a mold cavity between said upper and lower molds;
    generating melted resin on the main surface of said board and enclosing said electronic component in said melted resin only by heating and melting only said solid resin material in said mold cavity; and
    forming a resin mold product by setting only said melted resin that was generated from said solid resin material in said mold cavity.

6. The method of resin encapsulation according to claim 5, wherein
    said solid resin material has such a size and a shape that correspond to a size and a shape of said cavity; and
    said melted resin is generated by heat transmitted from said upper mold to said solid resin material.

7. The method of resin encapsulation according to claim 5, wherein
    said solid resin material is formed such that a space formed by said board and said solid resin material encloses said electronic component, when said solid resin material is placed on the main surface of said board; and
    said space is set to have such a size that said solid resin material is not in contact with the conductive material connecting the electrode of said board with the electrode of said electronic component.

8. A method of manufacturing a semiconductor device, using the method of resin encapsulation according to claim 5.

9. The method of resin encapsulation according to claim 1, wherein said step of placing said solid resin material in said cavity comprises transporting and depositing said solid resin material into said cavity using a vacuum-holding conveyor.

* * * * *

UNITED STATES PATENT AND TRADEMARK OFFICE
CERTIFICATE OF CORRECTION

| | | |
|---|---|---|
| PATENT NO. | : 7,056,770 B2 | Page 1 of 1 |
| APPLICATION NO. | : 10/719379 | |
| DATED | : June 6, 2006 | |
| INVENTOR(S) | : Uragami et al. | |

It is certified that error appears in the above-identified patent and that said Letters Patent is hereby corrected as shown below:

Column 10,
Line 7, before "cavity", insert --lower mold--.

Signed and Sealed this

Third Day of July, 2007

JON W. DUDAS
*Director of the United States Patent and Trademark Office*